United States Patent [19]
Schultz et al.

[11] Patent Number: 5,995,376
[45] Date of Patent: *Nov. 30, 1999

[54] CHASSIS WHICH INCLUDES CONFIGURABLE SLOT 0 LOCATIONS

[75] Inventors: Kevin L. Schultz, Pflugerville; Bob Mitchell, Austin, both of Tex.; David Henry Dorr; Timothy Lynn Moor, both of Mission Viejo, Calif.

[73] Assignee: National Instruments Corporation, Austin, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/859,028

[22] Filed: May 20, 1997

[51] Int. Cl.$^6$ ....................................................... H05K 1/14
[52] U.S. Cl. .......................... 361/788; 361/724; 361/725; 361/727; 361/728; 361/729; 174/50.54; 174/52.1
[58] Field of Search ..................................... 361/788, 724, 361/725, 727, 728, 729, 730, 732, 800, 748, 752, 784, 816; 174/50.52, 50.54, 52.1, 59

[56] References Cited

U.S. PATENT DOCUMENTS

| | | | |
|---|---|---|---|
| 5,031,075 | 7/1991 | Casanova et al. | 361/802 |
| 5,168,171 | 12/1992 | Tracewell | 307/64 |
| 5,189,598 | 2/1993 | Bolan et al. | 361/748 |
| 5,488,541 | 1/1996 | Mistry et al. | 361/788 |
| 5,546,562 | 8/1996 | Patel | 395/500 |
| 5,638,259 | 6/1997 | McCarthy et al. | 361/800 |
| 5,642,290 | 6/1997 | Reilly et al. | 364/492 |

OTHER PUBLICATIONS

Publication by Racal Instruments entitled, "1274–S–7992 Interface Connector Assembly," Publication No. 980612–005 dated Dec. 1992, Amended Oct. 1994, Mar. 1995, Sep. 1996, pp. 5–37, 5–56, (a) & (b).

*Primary Examiner*—Leo P. Picard
*Assistant Examiner*—David Foster
*Attorney, Agent, or Firm*—Conley, Rose & Tayon; Jeffrey C. Hood

[57] ABSTRACT

A VXI chassis which has user selectable or configurable slot 0 locations. The VXI chassis includes a personality module interface coupled to the VXI backplane comprised in the chassis. The personality module interface or slot is adapted to receive a personality module. The personality module can be inserted into the personality module interface or slot in one of a plurality of orientations. Based on the orientation of the inserted personality module, the personality module is operable to selectively route signals on the backplane to enable one of a plurality of locations to operate as the slot 0 location. In the preferred embodiment, the VXI chassis can house a plurality of C size and/or B size VXI/VME cards, and the VXI chassis is configurable between different slot 0 locations for different size cards, i.e., between either a C-size or B-size slot 0 controller. Thus the VXI chassis of the present invention provides an innovative solution for using both C-size VXI and B-size VXI/VME resources in a single system. The selection of a C-size or B-size slot 0 controller provides increased options to the user and reduces system costs.

30 Claims, 9 Drawing Sheets

CHASSIS WHICH INCLUDES CONFIGURABLE SLOT 0 LOCATIONS

FIELD OF THE INVENTION

The present invention relates to a VXI chassis which can house VME and VXI instruments, and more specifically to a VXI chassis which can receive either C-size or B-size slots, and which can be configured to be controlled either by a B-size or a C-size slot zero controller.

DESCRIPTION OF THE RELATED ART

An instrument is a device which collects data or information from an environment or unit under test and displays this information to a user. An instrument may also perform various data analysis and data processing on acquired data prior to displaying the data to the user. Examples of various types of instruments include oscilloscopes, digital multimeters, pressure sensors, etc., and the types of information which might be collected by respective instruments include voltage, resistance, distance, velocity, pressure, frequency of oscillation, humidity or temperature, among others.

The various hardware interface options currently available for instrumentation systems can be categorized into four distinct types, including IEEE 488-controlled instruments (GPIB instruments), VXI bus instruments, plug-in data acquisition (DAQ) boards, and RS-232-controlled (serial) instruments. Background on the VXI hardware interface option is deemed appropriate.

Figure 1:
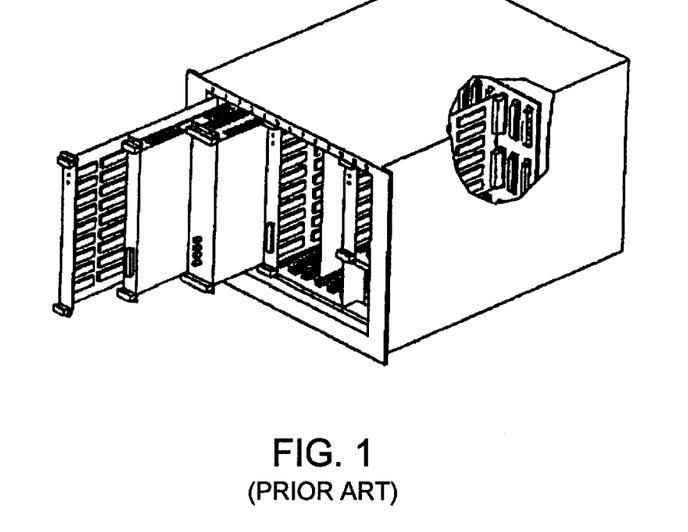
FIG. 1 illustrates a typical prior art C size chassis with a cut away showing how the P1 and P2 connectors affix to the VXI chassis backplane.

The VXI (VME extension for Instrumentation) bus is a platform for instrumentation systems that was first introduced in 1987 and was originally designed as an extension of the VME bus standard. The VXI standard has experienced tremendous growth and acceptance around the world and is used in a wide variety of traditional test and measurement and ATE applications. The VXI standard uses a mainframe chassis with a plurality of slots to hold modular instruments on plug-in boards or modules. A VXI chassis is illustrated in FIG. 1. The VXI architecture is capable of interfacing with both message based instruments and register based instruments. A message based instrument is an instrument which is controlled by a string of ASCII characters, whereas a register based instrument is controlled by writing a bitstream of 1's and 0's directly to registers in the instrument hardware.

One slot in a VXI chassis, typically the left-most slot, is known as slot zero. Slot zero is a slot in the VXI chassis reserved for a slot 0 controller. A slot 0 controller is a VXI device which includes special hardware features used for management of the VXI backplane. Only a device designed or configured to be a slot zero device should occupy this slot. Examples of slot 0 functionality include clock sourcing, bus arbitration, module identification and synchronization. Slot 0 devices include embedded CPUs, VXI-MXIs, and GPIB-VXIs. Slot 0 devices can be configured to operate as non-slot 0 devices for such applications as multiple chassis buses, addition of slave CPUs, and increase of embedded CPU capability. As noted above, devices which are not designed as slot zero devices can not be used in slot zero.

Figure 2:
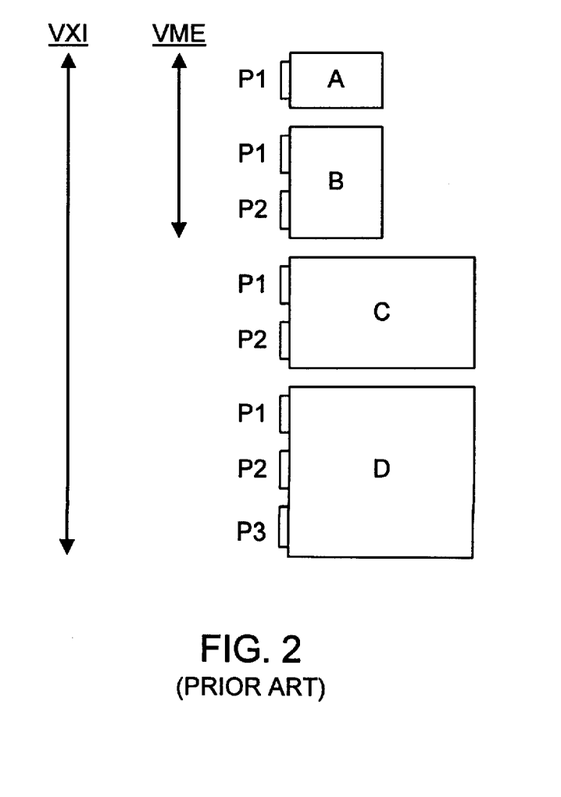
FIG. 2 is a prior art diagram illustrating the 4 different sizes of VXI cards that the VXI specification defines for use in VXI mainframes.

As shown in FIG. 2, the VME specification defines two card sizes, referred to as 3U (3.9 in. by 6.3 in.) and 6U (9.2 in. by 6.3 in.). The VXI specification defines card sizes referred to as A and B cards, which correspond to the 3U and 6U card sizes, respectively. The VXI specification also adds two larger sized cards, referred to as C (9.2 in. by 13.4 in.) and D (14.4 in. by 13.4 in.). By far, the most popular size VXI card is the C size. The next most common size VXI card used in the industry is the B size.

VXI and VME cards have associated backplane connectors referred to as P1, P2 and P3. These "P" connectors provide the interface between the signals on the VXI card and the chassis backplane. The A size card only has a P1 connector, the B and C size cards have both P1 and P2 connectors, and the D size card adds a P3 connector in addition to P1 and P2. The P1 connector is unchanged from the VMEbus and is adapted to conduct signals which provide 16-bit data transfer, 16-MB addressing, mulitmaster arbitration, priority interrupt, and utilities bus. The center row of the P2 connector is unchanged from the VMEbus and operates to conduct additional data and address signals which increase data width to 32 bits and increase the available address space to 4 GB of address space. The outer rows of the P2 connector, which were reserved in the VME specification, are defined under the VXI specification. The outer rows of the P2 connector conduct signals including a 10 MHz clock, TTL (transistor-transistor logic) and ECL (Emitter Coupled Logic) trigger lines, 12-line (24 pins) local bus, analog sum bus, module identification (MODID) bus and increased power. The P3 connector is defined in the VXI bus specification and is adapted to conduct signals such as a 100 MHz clock, ECL STAR trigger bus, ECL trigger bus, 24 line (48 pin) local bus, and additional power distribution signals.

VXI and VME instrument cards or modules generally include a faceplate comprising set screws. Once the card is inserted into a slot of the VXI chassis and the "P" connectors attached to the backplane, the card faceplate can be secured to the front of the VXI chassis to prevent accidental removal of the instrument from the backplane which can cause electrical damage to the chassis, the instruments, and the controller.

As noted above, the most common size card is the C size. However, often times many test and measurement applications require a VME or VXI card that is B size, either for an intent or as a slot zero controller. In other instances it is desirable to include a B size card as a controller in an instrumentation application. For example, B size cards as a controller provide a lower cost solution than C size card controllers. The B size cards reduce cost because they are smaller and do not require EMI shielding as is required for C size cards. Furthermore, the use of a B size card as a controller frees up an additional C size slot from having to act as slot 0, thus enabling more C size instruments to be housed in the VXI chassis for test and measurement.

Since the most common size card is C size, most commercial VXI chassis provide only C size slots. FIG. 1 illustrates a conventional VXI chassis which is only capable of housing C-size cards. However, a B size card requires an adapter to operate in a VXI chassis which includes only C size slots. Since the B size card is shorter length than the C size card, either the face plate of the B size instrument would have to be removed in order for the card's P1 and P2 connectors to reach the backplane, or special extenders would be required so that the P1 and P2 connectors would reach the backplane.

Applicant is aware that at least one instrument vendor, Hewlett Packard, has developed and sold a VXI/VME chassis which can receive both C-size and B-size cards. However, this chassis has a reserved or pre-determined slot 0 location and thus is permanently configured for either a C-size or B-size slot 0 controller. It would be desirable for the VXI chassis to be able to selectably accept either a C-size card or a B-size card as the slot 0 controller. It would more generally be desirable to provide a VXI chassis which has a user configurable or selectable slot 0 location.

SUMMARY OF THE INVENTION

The present invention comprises a VXI chassis which has user selectable or configurable slot 0 locations. The VXI chassis includes a personality module interface coupled to the VXI backplane comprised in the chassis. The personality module interface or slot is adapted to receive a personality module. The personality module can be inserted into the personality module interface or slot in one of a plurality of orientations. Based on the orientation of the inserted personality module, the personality module is operable to selectively route signals on the backplane to enable one of a plurality of locations to operate as the slot 0 location.

In the preferred embodiment, the VXI chassis can house a plurality of C size and/or B size VXI/VME cards, and the VXI chassis is configurable between different slot 0 locations for different size cards, i.e., between either a C-size or B-size slot 0 controller. Thus the VXI chassis of the present invention provides an innovative solution for using both C-size VXI and B-size VXI/VME resources in a single system. The selection of a C-size or B-size slot 0 controller provides increased options to the user and reduces system costs.

In the preferred embodiment, the VXI chassis comprises a housing which is configured to define a plurality of slots. The housing includes a first plurality of C-size slots adapted to receive C-size cards, and a second plurality of B-size slots adapted to receive B-size cards. A backplane is comprised in the housing and is adapted for transmitting electrical signals. A first plurality of C-size connectors are positioned in the housing at the rear of the C-size slots and electrically coupled to the backplane, and a second plurality of B-size connectors are positioned in the housing at the rear of the B-size slots, also electrically coupled to the backplane.

As described above, the VXI chassis includes a personality module interface coupled to the backplane. The personality module interface or slot is adapted to receive the personality module. In the preferred embodiment, the personality module can be inserted into the personality module interface or slot in one of either of two orientations. The personality module is operable to selectively route signals on the backplane to enable one of either the first plurality of C-size connectors or the second plurality of B-size connectors B0–B2 to receive an expansion card which operates as a slot 0 controller.

The VXI chassis is thus easily configurable with the slot 0 resource in either the front (C size location) or the rear (B size location) of the chassis, due to the unique backplane design of the present invention. Thus, a B size slot 0 VXI controller can be used in the system, freeing up all six C size slots for instruments. Since the B size slots are completely VXI compliant, the user can take advantage of all of the VXI capabilities for slot identification resource initialization and management with lower cost while enabling use of all six C size slots for instrument modules. Also, a standard C size slot 0 VXI controller can be used in the VXI chassis system, thus enabling use of three B size VXI/VME slots in the rear of the chassis to incorporate VME memory cards or special purpose modules.

BRIEF DESCRIPTION OF THE DRAWINGS

A better understanding of the present invention can be obtained when the following detailed description of the preferred embodiment is considered in conjunction with the following drawings, in which:

FIG. 8 illustrates the personality module which controls whether the slot 0 location is a B-size or C-size slot; FIG. 8 also illustrates the corresponding VXI chassis slot for the personality module;

FIGS. 9 and 10 schematically illustrate the interconnection and signal routing between the B and C size slots and the change in the signal lines dependent on the orientation of the personality module.

DETAILED DESCRIPTION OF THE PREFERRED EMBODIMENT

Figure 3:
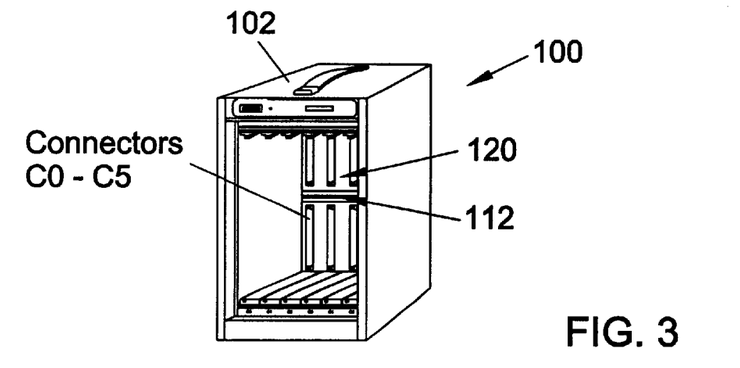
FIG. 3 is a perspective front view of the VXI chassis of the preferred embodiment of the invention.
Figure 4:
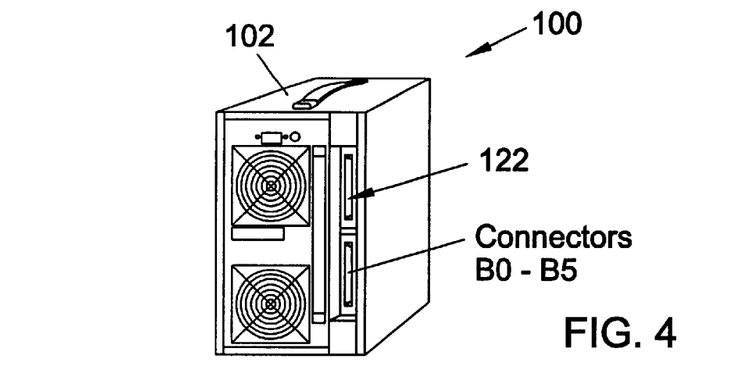
FIG. 4 is a perspective back view of the VXI chassis including a VXI card inserted into B-size slot 0.
Figure 5:
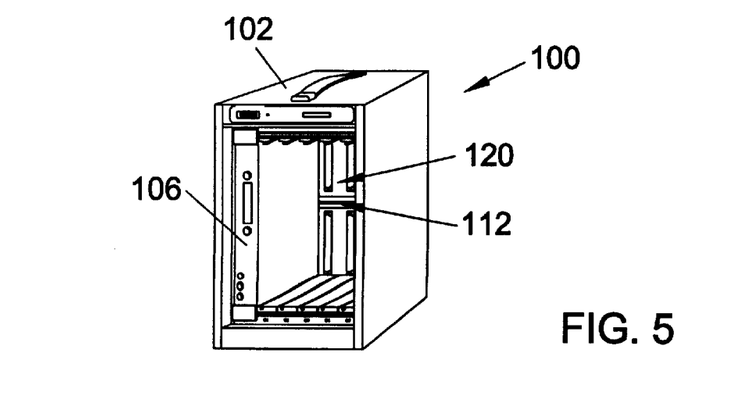
FIG. 5 is a perspective front view of the VXI chassis including a VXI card inserted into C-size slot 0.

FIGS. 3–5: VXI Mainframe

Referring now to FIG. 3, a VXI mainframe or chassis 100 according to the preferred embodiment of the invention is shown 1. FIG. 3 illustrates a front view of the VXI chassis 100, and FIG. 4 illustrates a back view of the VXI chassis 100. In the present disclosure, the terms "chassis" and "mainframe" are used interchangeably to refer to a physical structure for housing expansion cards.

The chassis 100 comprises a housing or structural enclosure 102. It is noted that the housing 102 may take any of various shapes or configurations, as desired. As shown, the housing 102 is configured to define a plurality of slots for receiving cards. In the preferred embodiment, a first subset of the plurality of slots is adapted to receive cards of a first size, and a second subset of the plurality of slots is adapted to receive cards of a second size. In the preferred embodiment, the chassis 100 or housing 102 is adapted to receive VME and/or VXI expansion cards. FIG. 5 illustrates a front view of the chassis 100 with a VXI card 106 inserted into one of the slots.

In the preferred embodiment, the housing 102 defines a plurality of C-size slots, referred to as C0–C5 (FIG. 6), adapted for receiving C-size cards, and the housing 102 defines a plurality of B-size slots, referred to as B0–B2 (FIG. 7), adapted for receiving B-size cards. The C-size slots are preferably configured on a first side of the housing 102, preferably the front side, and the B-size slots are preferably configured on a second opposite side of the housing 102, preferably the back side. It is noted that the C-size slots and B-size slots may be configured in any of various types of positions in the housing 102, as desired. In the Figures shown, the front view of the chassis 100 in FIG. 3 illustrates the C-size slots, and the back view of the chassis 100 in FIG. 4 illustrates the B-size slots. In the preferred embodiment, the chassis 100 includes 6 C-size slots C0–C5 and 3 B-size slots B0–B2 for a total of 9 slots.

The chassis 100 further comprises a backplane 110 (FIGS. 9 and 10) comprised in the housing 102 and adapted for transmitting electrical signals. In the preferred embodiment, the backplane is a VXI backplane adapted for transmitting VXI signals.

The chassis 100 preferably comprises a structural member 112 positioned in the housing 102. The structural member 112 is positioned in the housing 102 and physically supports the C-size and B-size slots. The backplane 110 is comprised on the structural member 112.

A first plurality of connectors 120 associated with C-size slots C0–C5, and a second plurality of connectors 122 associated with B-size slots B0–B2, are preferably positioned on the structural member 112 and are electrically coupled to the backplane 110. The first plurality of connectors 120 are shown in the front view of FIG. 3, and the second plurality of connectors 122 are shown in the back view of FIG. 4. The first plurality of connectors 120 are positioned in the housing 102 proximate to the first subset of the plurality of slots, and the second plurality of connectors 122 are positioned in the housing 102 proximate to the second subset of the plurality of slots. In other words, the first plurality of connectors 120 are positioned at the rear of the C-size slots C0–C5 and are adapted to receive C-size expansion cards, and the second plurality of connectors 122 are positioned at the rear of the B-size slots B0–B2 and are adapted to receive B-size expansion cards. The C-size connectors 120 and B-size connectors 122 are shown more clearly in FIGS. 6 and 7, respectively. It is noted that the reference designations C0–C5 are used herein to primarily refer to the C-size slots, and can also be used to refer to the different C-size connectors 120. Likewise, the reference designations B0–B2 are used herein to primarily refer to the B-size slots, and can also be used to refer to the different B-size connectors 122.

In the present disclosure, the term "slot" is intended to include the physical opening defined by the housing 102 which is adapted to receive an add-in card or expansion card. The term "slot" may also include the connector within the slot. The term "connector" is used to refer to the electrical interface comprised in a slot as well as the electrical connector comprised on an add-in card. Thus, an electrical connector positioned at the rear of a slot is adapted to electrically mate with a corresponding connector on the add-in card. More specifically, a slot includes a female electrical interface or connector which is adapted to electrically mate with a corresponding male connector on the add-in card. It is noted that the term "connector" is intended to encompass any of various means of electrical interconnection of signals, as desired.

The chassis 100 further preferably includes a personality module interface or connector (162, FIG. 8) coupled to the backplane. The personality module interface or connector 162 is adapted to receive a personality module (160, FIG. 8). The personality module 160 can be inserted into the personality module interface or connector 162 in one of a plurality of orientations, preferably one of either of two orientations. The personality module 160 is operable to selectively route signals on the backplane to enable one of the first plurality of connectors corresponding to slots C0–C5, or one of the second plurality of connectors corresponding to slots B0–B2, to operate as a slot 0 connector, i.e., to enable the respective connector to receive an expansion card which operates as a slot 0 controller.

The VXI chassis 100 of the preferred embodiment can house six C size VXI modules and three B size VXI/VME cards for a total of nine useable slots. Using the VXI chassis 100 of the present invention, adapter cards are no longer required for interfacing B size modules into a C size chassis.

Figure 6:
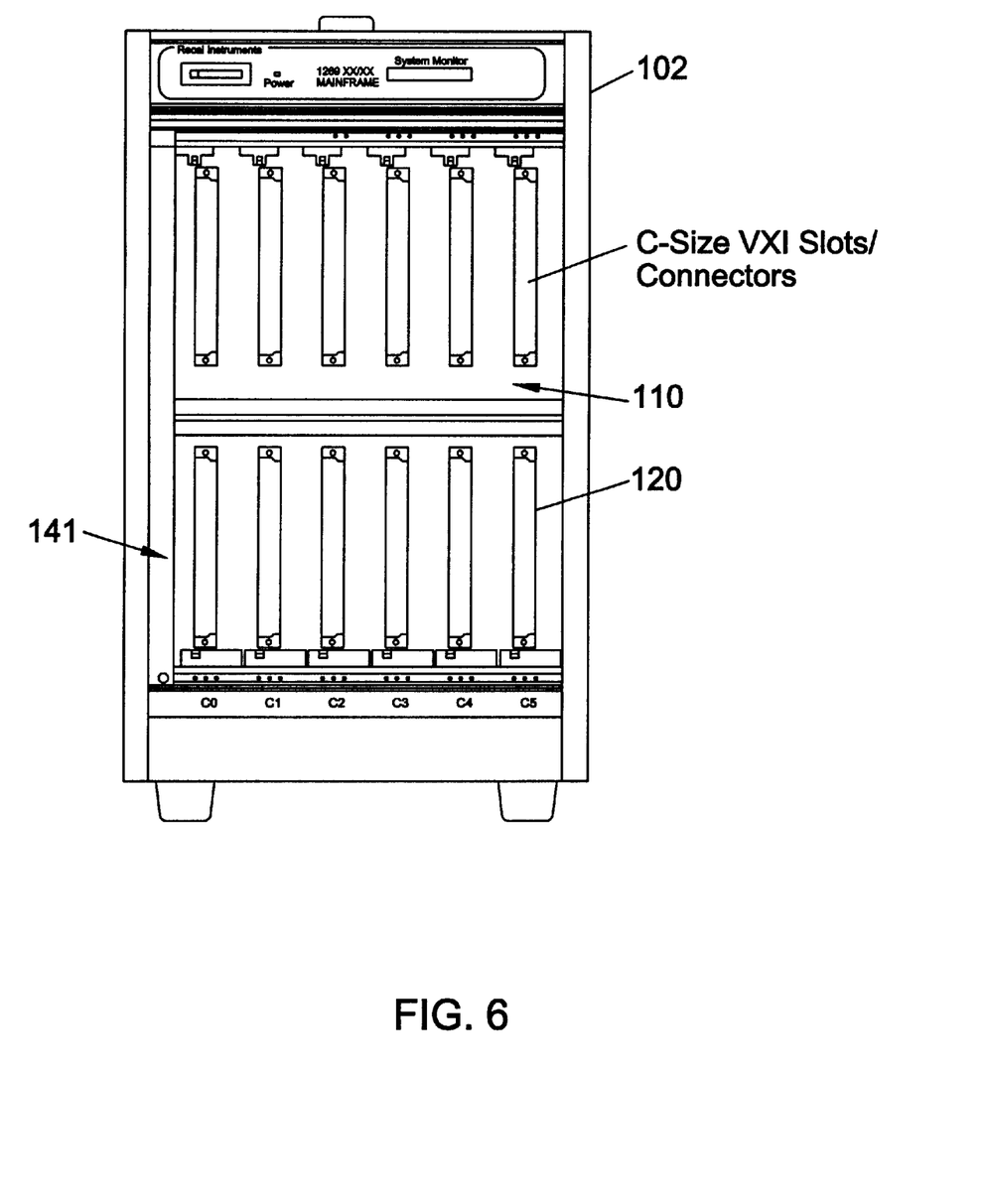
FIG. 6 is a front view of the VXI chassis of the preferred embodiment showing the six C size slots.

FIG. 6—VXI Mainframe Front View

Referring now to FIG. 6, a front view of the VXI chassis 100 is shown. As shown, the VXI chassis 100 includes a plurality of C-size slots C0–C5 and corresponding connectors. Each C-size connector 120 comprises a P1 and P2 connector. The C-size slots C0–C5 allow the insertion of C-size cards for coupling to the P1 and P2 connectors. The C-size slots C0–C5 and respective connectors are fully compliant with the VXI specification and are adapted for use with C-size VXI/VME cards. The chassis 100 is capable of accepting C-size modules that occupy more than one slot. It is noted that, if all of the B-size slots are filled, and additional B-size cards are desired, B-size cards can be adapted for use in the C size slots, if desired.

When the chassis 100 is configured with a B-size card as the slot 0 controller, any non-slot 0 C-size device, can be used in the C-size slots. When the chassis 100 is configured with a C-size slot to receive the slot 0 controller, usual care must be taken not to place a non-slot 0 device in the C-size slot 0. FIG. 6 also shows a covering 141 which covers or hides the personality module 160 in this figure.

Figure 7:
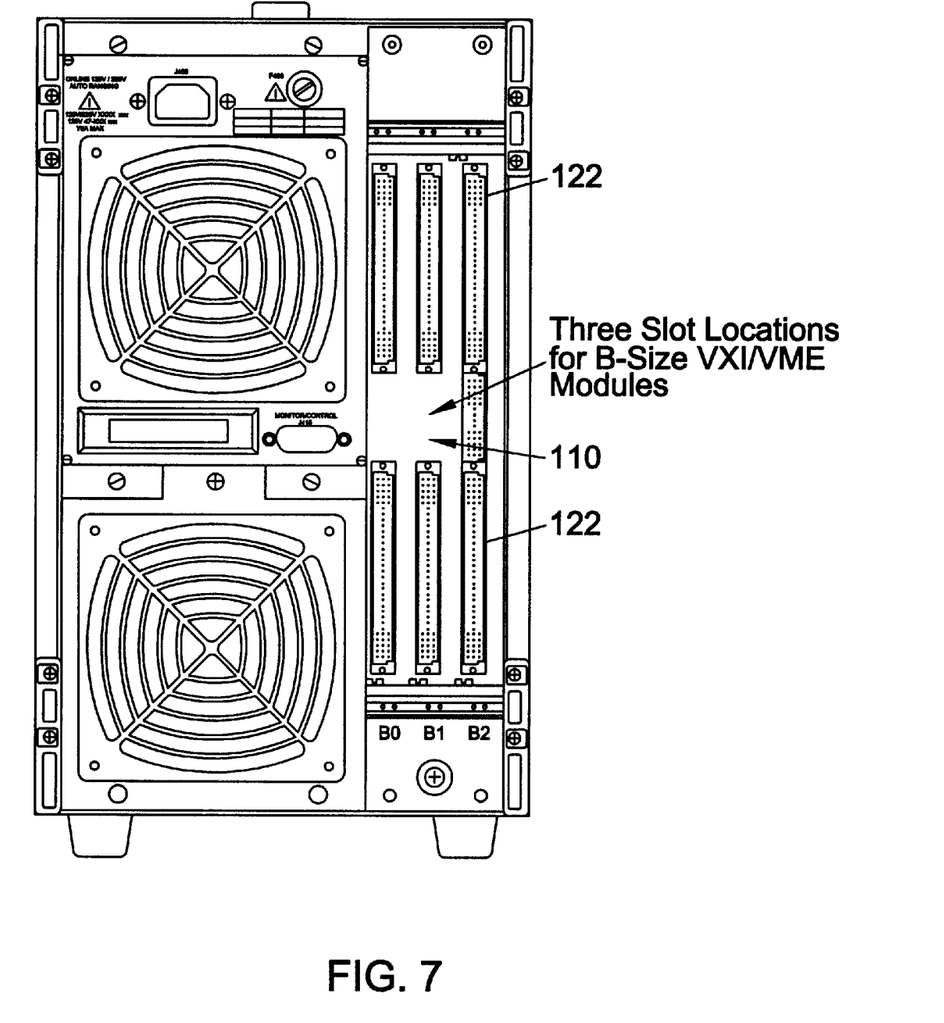
FIG. 7 is a back view of the VXI chassis of the preferred embodiment showing the 3 B size slots.

FIG. 7—VXI Mainframe Back View

Referring now to FIG. 7, a back view of the VXI chassis 100 is shown. As shown, the back of the VXI chassis 100 includes a plurality of B-size slots B0–B2 and corresponding connectors. Each B-size connector 122 comprises a P1 and P2 connector. The B-size slots B0–B2 allow the insertion of B-size cards for coupling to the P1 and P2 connectors. The B-size slots B0–B2 and respective connectors are fully compliant with the VXI/VME specification and are adapted for use with B-size VXI/VME cards.

The incorporation of the B-size slots in the back of the VXI chassis 100 allows the user to add B-size cards to conventional B-size slots in the VXI chassis 100. This enables the addition of B-size slots to a chassis comprising C-size slots without requiring an extender or removal of the face plate of the instrument. In addition, if the left most B slot is used as the slot 0 controller, all of the C-size slots remain available for use as instruments. When the chassis 100 is configured with a B-size slot to receive the slot 0 controller, usual care must be taken not to place a non-slot 0 device in the B-size slot 0. As shown, the back of the chassis 100 also houses cooling fans to remove the heat generated by the VXI backplane and instruments.

In the preferred embodiment, the chassis comprises B-size and C-size slots oriented back-to-back, so that the P connectors in the B slots and the P connectors in the C slots are facing in opposite directions.

Figure 8:
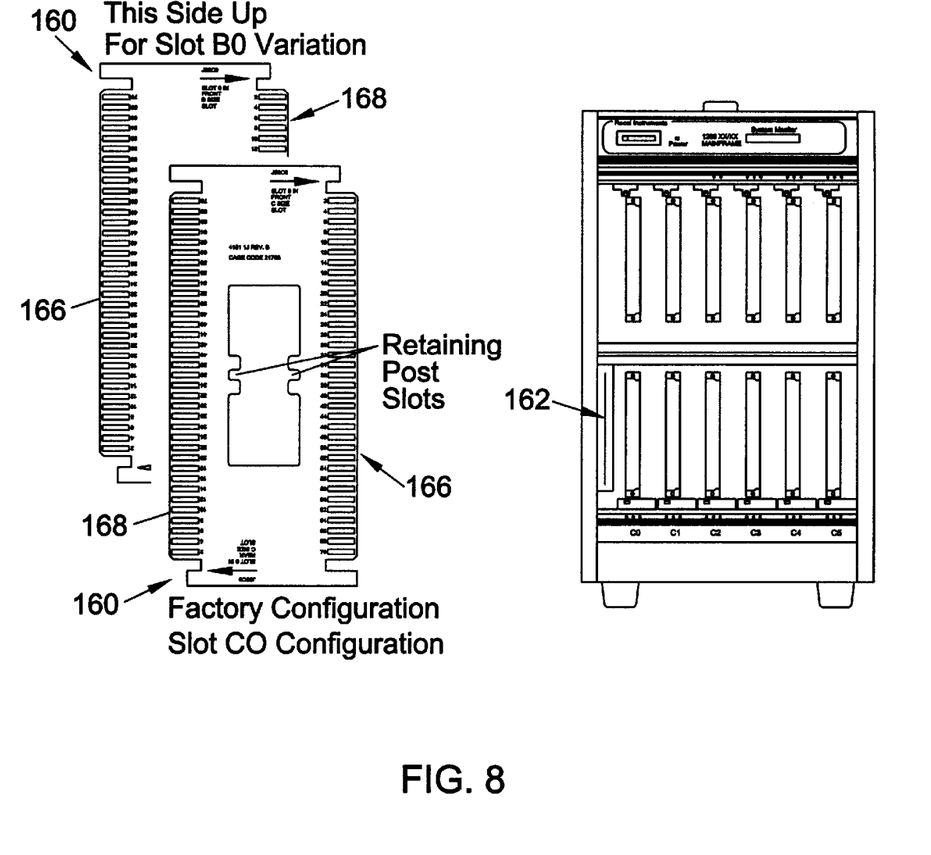

FIG. 8—Personality Module

Referring now to FIG. 8, a personality module 160 is shown. FIG. 8 actually illustrates the personality module 160 twice, i.e., illustrates the personality module 160 in two different orientations. FIG. 8 also illustrates the front of the VXI chassis 100 with the personality module faceplate 141 removed from the front of the housing 102, i.e., not shown in this figure, exposing the personality module interface or connector 162. The personality module interface 162 is preferably a standard card edge connector. The personality module interface 162 is designed to receive the personality module 160.

The orientation of the personality module 160 within the personality module interface or connector 162 determines the slot 0 configuration, i.e., determines whether the left most B size slot or the left most C size slot will be the slot 0 receiving the VXI slot 0 controller. As shown, the personality module 160 comprises a card which includes edge connectors on two sides. As noted above, FIG. 8 illustrates the personality module 160 in two different orientations. When the personality module 160 is in the C-size slot 0 orientation, a first set of personality module edge connectors 166 on a first side of the personality module 160 are applied to the personality module connector 162, and the slot 0 signal lines in the backplane are routed to the front of the VXI chassis 100 to the left-most C-size slot. When the personality module 160 is in the B-size slot 0 orientation, a second set of personality module edge connectors 168 on a second side of the personality module 160 are applied to the personality module connector 162, and the slot 0 signal lines in the backplane are routed to the back of the VXI chassis 100 to the left most B-size slot.

As shown in FIG. 8, the VXI chassis 100 is preferably provided in a factory configuration wherein the personality module 160 is configured to select the C-size slot 0. In other words, in the factory configuration, the VXI chassis 100 is provided such that the first set of personality module edge connectors 166 on the first side of the personality module 160 are inserted into the personality module connector 162. The personality module 160 can be removed and re-inserted with the other edge connector 168 in the personality module slot 162 to select the B-size slot 0.

In the preferred embodiment, the VXI chassis 100 includes a personality module plug-in card 160 for selectively routing the VXI signals to enable configurable slot 0 connectors. However, it is noted that other apparatus or methods may be used for selectively routing the VXI signals, i.e., other apparatus or methods may be used for switching the slot 0 location of the VXI mainframe. In another embodiment, jumpers and/or dip switches are used to enable the user to selectively route the VXI signals and hence selectively configure the VXI chassis with different slot 0 locations. In another embodiment, the slot 0 location is selected programmatically in software. Other methods for changing or selecting the slot 0 location within the VXI chassis 100 may be used as desired. In the present application, the term "signal routing means" is used herein to refer to various apparatus and/or methods for selectively routing the VXI signals to enable configurable slot 0 connectors, wherein the term "signal routing means" includes the personality module 160, jumpers, dip switches, programmable logic/software, and other means for selectively routing the signals.

Figure 8A:
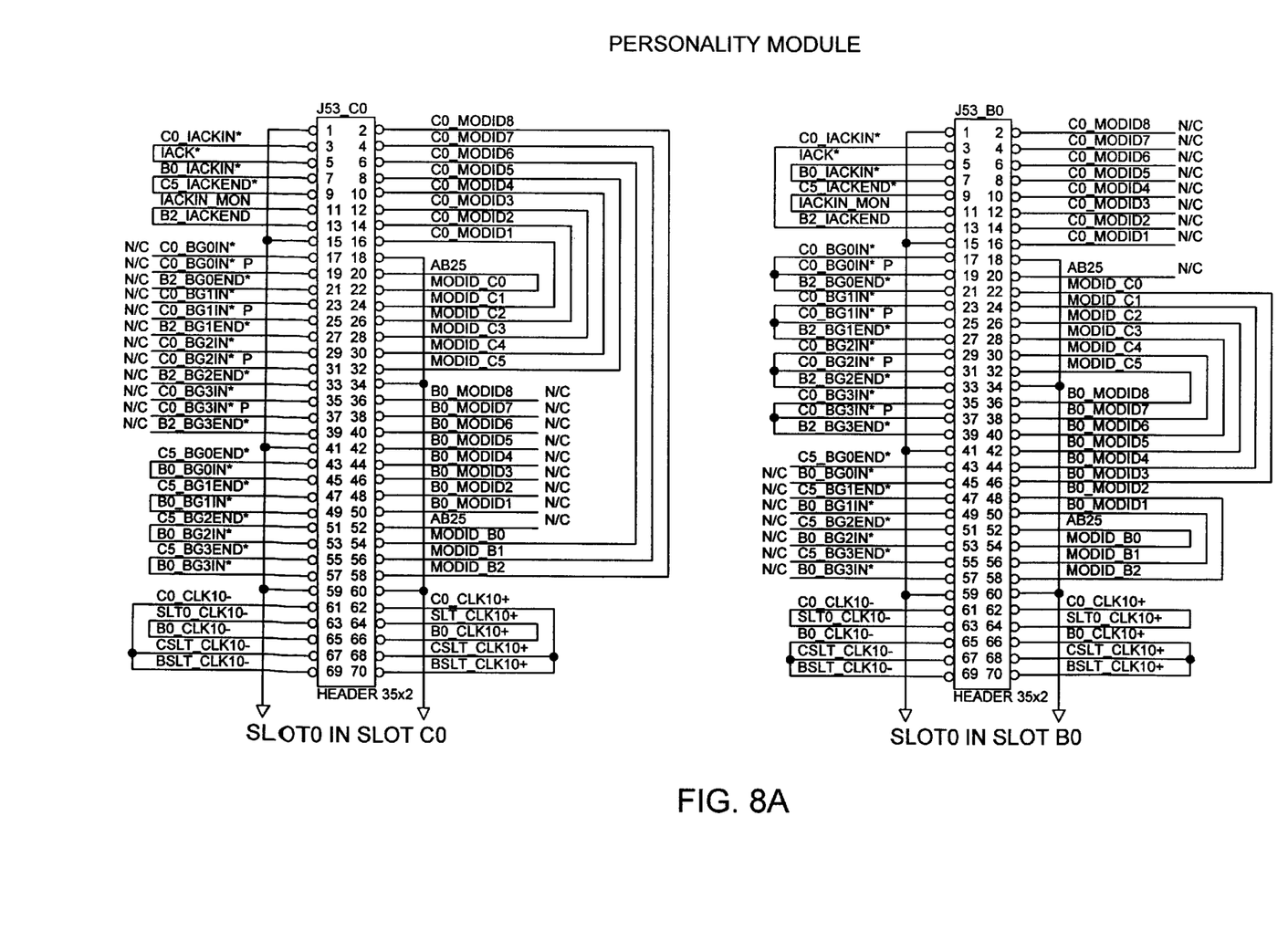
FIG. 8A illustrates the pinout of the personality module edge connectors.

FIG. 8A—Personality Module Edge Connectors

Referring now to FIG. 8A, the connector pinout of each of the edge connectors comprised on the personality module 160 is shown. FIG. 8A illustrates the electrical definition of the connectors on the personality module 160 and also shows how signals are routed on the personality module connector 162 when the personality module is in slot C0 and slot B0 orientations.

Figure 11:
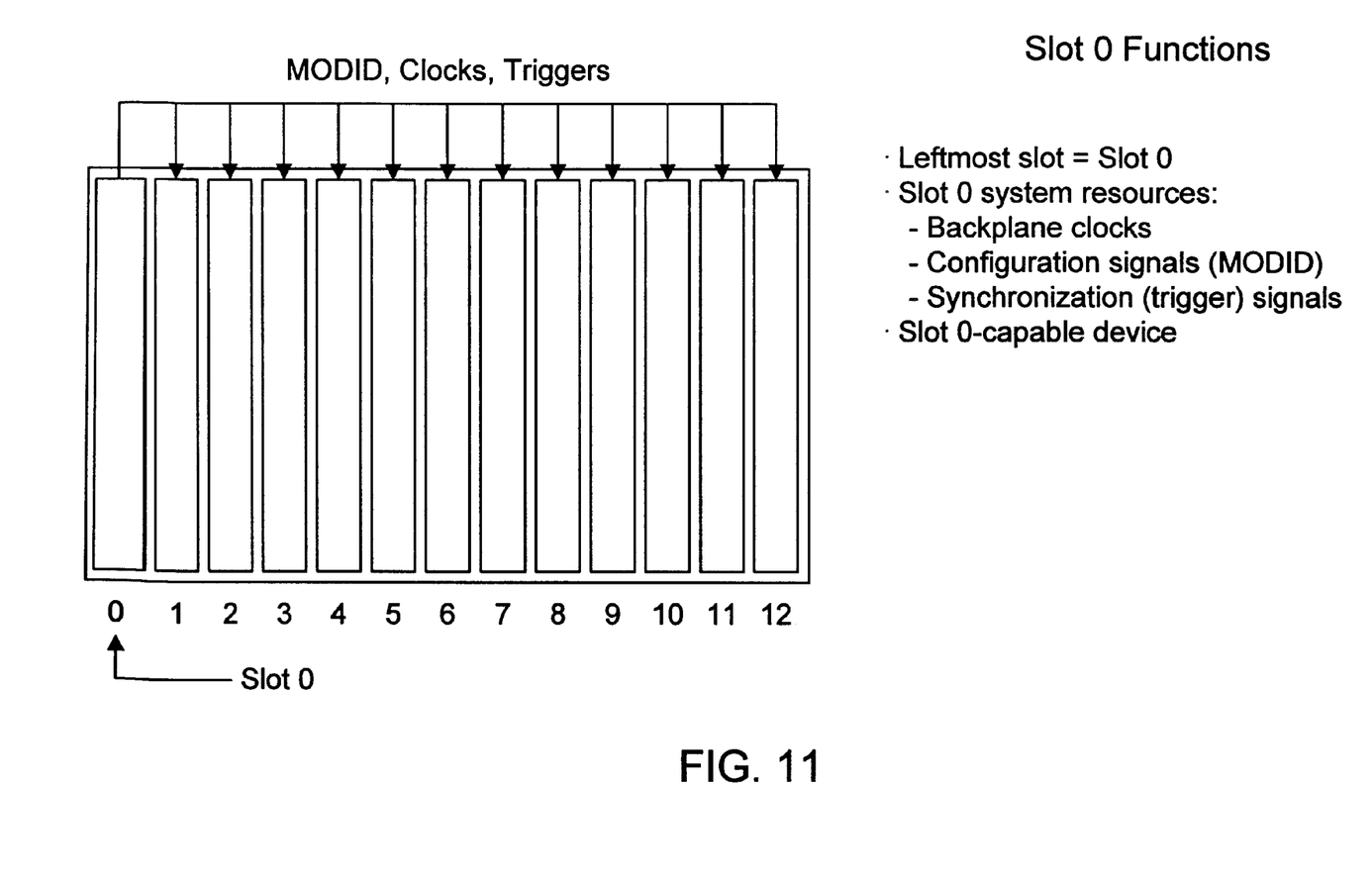
FIG. 11 illustrates the functions of the slot 0 controller.

FIG. 11—Slot 0 Functions

As discussed above, at least one slot in a VXI mainframe or chassis, typically the left-most slot, is reserved for slot 0, i.e., a slot 0 device must occupy this slot. In general, slot 0 refers to special hardware features that must be available. As shown in FIG. 11, a slot 0 device is responsible for backplane management, including clock sourcing, bus arbitration, and slot/module identification, among others. Background on some of the slot 0 functions is provided below.

The slot 0 module has a centralized clock for timing and synchronization. In a system with C-size or B-size modules, the clock is a 10 MHz ECL (emitter coupled clock) referred to as CLK10.

The VXI bus includes a local bus for communication. The local bus is used so that adjacent modules can communicate with each other without using the VME Data Transfer Bus (DTB), enabling the DTB to be used for other purposes. The local bus can carry different levels of signals including TTL, ECL, and three bands of analog voltages. The Local Bus is routed from each slot to the adjacent slots to the right and left of that slot. The local bus provides 12 local bus lines per side for B-size and C-size modules on the P2 connector.

The VXI bus includes a Module Identification (MODID) bus whose purpose is to physically identify whether a module is plugged into a particular slot. A single MODID line is unique to each slot in the mainframe, and is fed back to the Slot 0 module. There is a weak pull-up resistor on the Slot 0 module for each MODID line. If a module is plugged into a slot, this weak pull-up is overcome for that slot, and the MODID line of the associated slot is pulled down. A Resource Manager, in conjunction with the Slot 0 module, can read the status of each MODID line, and consequently determine if a module is plugged into a particular slot. Each MODID line is also connected to a defined register bit in each device. By driving the MODID line for a particular slot, the Resource Manager can read the status of this bit on each device to determine which device is installed in that slot. Thus the system can use the MODID line to determine whether a module is plugged into a slot, even if the module is non-functional.

The VXI bus also includes arbitration and IACK signal lines. In the VME specification, the arbitration bus comprises six bused lines and four daisy-chained lines. The bus request and bus grant lines are referred to as BRx*, BGxIN*, and BGxOUT*, where x takes any value from 0 to 3. The signals entering each board are called Bus Grant IN lines (BGxIN*), while the signals leaving each board are called Bus Grant OUT lines (BGxOUT*). The lines that leave slot n as BGxOUT* enter slot n+1 as BGXIN*. The Interrupt Acknowledge (IACK*) signal line runs the full length of the backplane and is connected to the IACKIN* pin of slot 1. When driven low, the IACKIN* pin causes the IACK daisy-chain driver, located in slot 1, to propagate a falling edge down the interrupt acknowledge daisy-chain.

For more information on the arbitration and IACK signal lines, or other aspects of the VME or VXI bus, please see "IEEE Standard for a Versatile Backplane Bus: VMEbus", published by the Institute of Electrical and Electronics Engineers (IEEE), ANSI Std 1014-1987, which is hereby incorporated by reference in its entirety as though fully and completely set forth herein.

For more information on slot 0 functions, or other aspects of the VXI bus, please see the VXI specification, available from the VXI Consortium, 8380 Hercules Drive, Suite P, La Mesa, Calif. 91942; Telephone: (619) 697-6650; Fax: (619) 697-5955, which is hereby incorporated by reference in its entirety as though fully and completely set forth herein.

Figure 9:
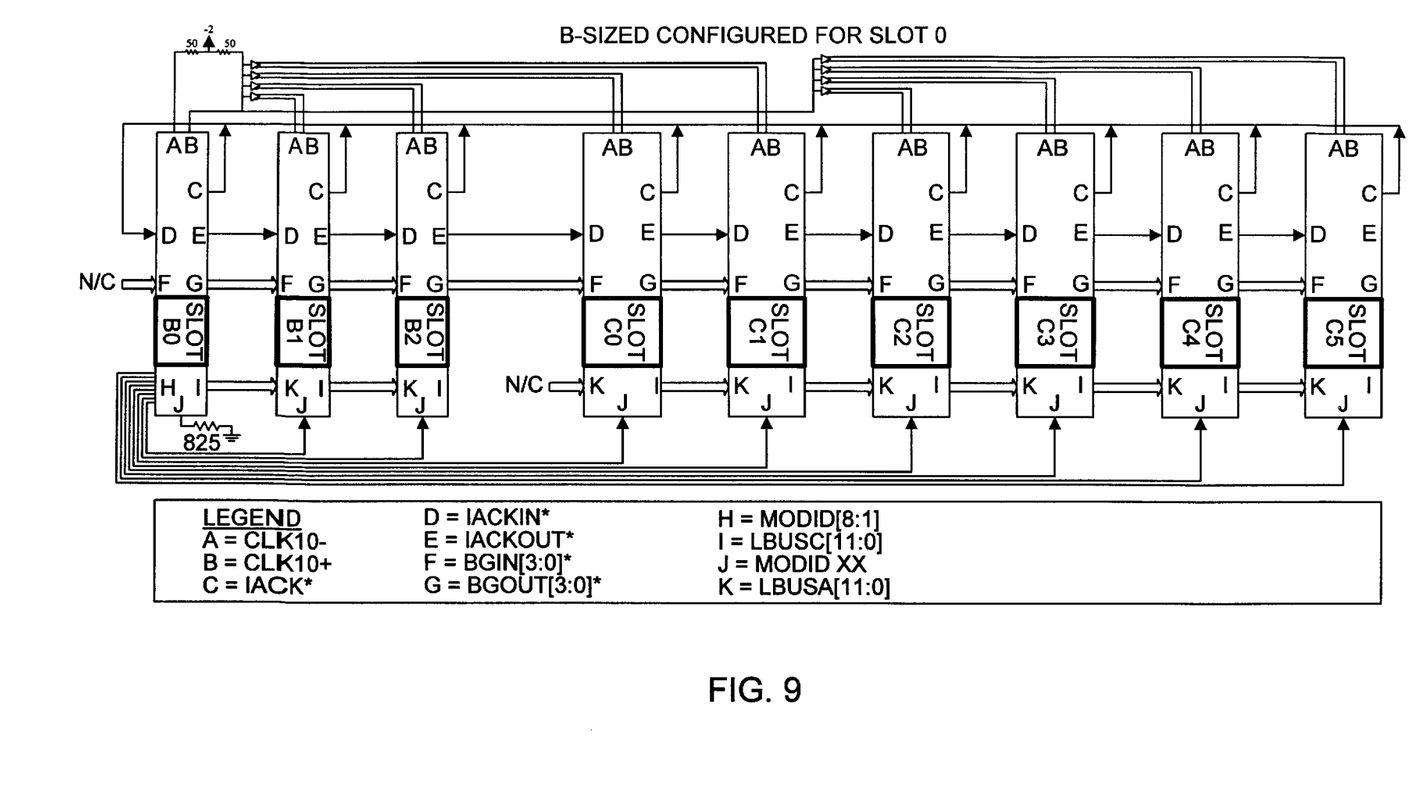
FIG. 9 illustrates the signal routing when the B-size slot is configured as slot 0.
Figure 10:
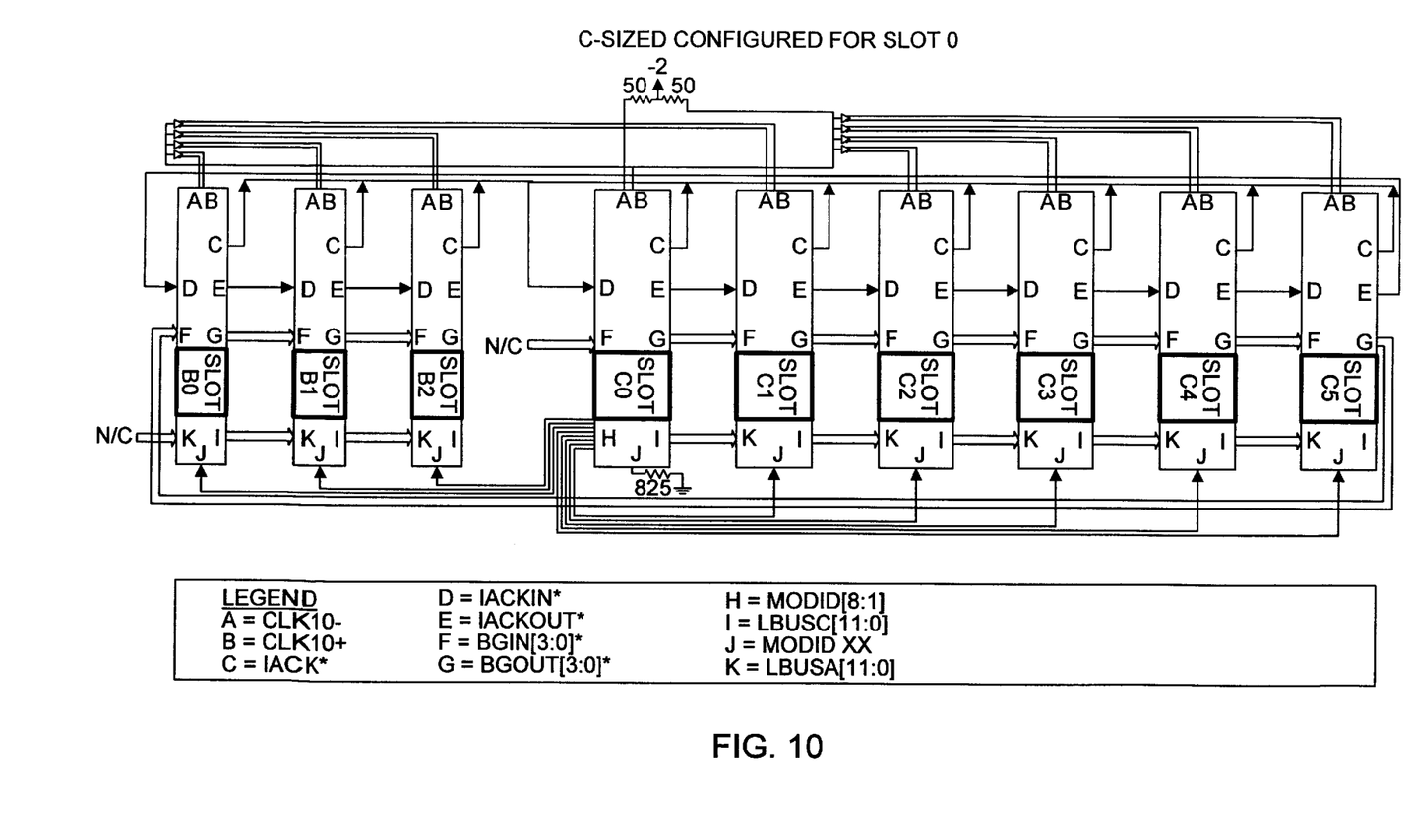
FIG. 10 illustrates the signal routing when the C-size slot is configured as slot 0.

FIGS. 9 and 10—VXI Signal Routing for Different Slot 0 Locations

FIGS. 9 and 10 illustrate VXI signal routing for the two different orientations of the personality module 160. FIG. 9 illustrates the VXI signal routing when the B-size slot is configured for slot 0, and FIG. 10 illustrates the VXI signal routing when the C-size slot is configured for slot 0. FIGS. 9 and 10 each use a legend shown in the respective figures. FIGS. 9 and 10 illustrate which lines are affected by the orientation of the personality module 160 and how they are subsequently routed.

FIG. 9 schematically illustrates the routing of the VXI signals when the personality module 160 is oriented such that the left most B-size slot is configured as slot 0, i.e., is configured to receive the slot 0 controller. As shown, when the personality module 160 is oriented to select the left most B-size slot as slot 0, the various slot 0 controller signals lines are sourced from the left-most B-size slot, slot 0, to the remaining B-size and C-size slots.

The clock source provides two clock signals referred to as CLK10−, designated in the Figure as A, and CLK10+, designated in the Figure as B. As shown, the CLK10− and CLK10+ signals are sourced from the B-size slot 0 and routed to the remaining B slots and to the C slots. The clocks are driven as a single source/single destination signal using buffers for each individual slot.

Interrupts are used by VXI servants to communicate with their commander. The Interrupt Acknowledge (IACK) signal, designated as C, is used by the commander in response to the interrupt from the servant. As shown, the IACK line C is routed from each slot into the slot 0 location's Interrupt Acknowledge In (IACKIN) line, designated as D, and routed out of the respective Interrupt Acknowledge Out (IACKOUT) line E. The IACKOUT terminates at the effective end of the IACK lines in the last C-size slot C5.

The Bus Grant In BGIN[3:0] lines, designated as F, begin at the first slot after slot 0, and each have a corresponding Bus Grant Out BGOUT[3:0] lines, designated as G. The BGIN[3:0] lines of slot 0 are not connected. The BGOUT [3:0] lines terminate at the BGIN[3:0] lines of the last C-size slot C5.

The Module Identification MODID[8:1] lines, designated as H, appear at only the slot 0 location and receive MODID XX signals, designated as J, from each remaining slot identifying the occupant of the various slots. The MODID XX line of the slot 0 device is grounded.

The Local Bus C LBUSC[11:0] signal lines, designated as I, are output from each slot, except the last slot C5, to the LBUSA[11:0] signals lines, designated as K, of the next or rightmost slot. The slot 0 device does not include LBUS [11:0] signal lines. The local bus is used so that adjacent modules can communicate with each other without using the VME Data Transfer Bus (DTB).

FIG. 10 schematically illustrates the routing of the VXI signals when the personality module 160 is oriented such that the left most C-size slot is configured as slot 0, i.e., is configured to receive the slot 0 controller. As shown, when the personality module 160 is oriented to select the left most C-size slot as slot 0, the various slot 0 controller signals lines are sourced from the left-most C-size slot, slot C0, to the remaining C-size and B-size slots.

The clock source provides two clock signals referred to as CLK10−, designated in the Figure as A, and CLK10+, designated in the Figure as B. As shown, the CLK10− and CLK10+ signals are sourced from the C-size slot C0 and routed to the remaining C slots and to the B slots. The clocks are driven as a single source/single destination signal using buffers for each individual slot.

Interrupts are used by VXI servants to communicate with their commander. The Interrupt Acknowledge (IACK) signal, designated as C, is used by the commander in response to the interrupt from the servant. As shown, the IACK line C is routed from each slot into the slot 0 location's Interrupt Acknowledge In (IACKIN) line, designated as D, and routed out of the respective Interrupt Acknowledge Out (IACKOUT) line E. The IACKOUT terminates at the effective end of the IACK lines in the last B-size slot B2.

The Bus Grant In BGIN[3:0] lines, designated as F, begin at the first slot after slot 0, and each have a corresponding Bus Grant Out BGOUT[3:0] lines, designated as G. The BGIN[3:0] lines of slot 0 are not connected. The BGOUT [3:0] lines terminate at the BGIN[3:0] lines of the last B-size slot B2.

The Module Identification MODID[8:1] lines, designated as H, appear at only the slot 0 location and receive MODID XX signals, designated as J, from each remaining slot identifying the occupant of the various slots. The MODID XX line of the slot 0 device is grounded.

The Local Bus C LBUSC[11:0] signal lines, designated as I, are output from each slot, except the last slot B2, to the LBUSA[11:0] signals lines, designated as K, of the next or rightmost slot. The slot 0 device does not include LBUS [11:0] signal lines.

As described above, the VXI chassis 100 of the present invention is configurable between different slot 0 locations, i.e., between either a C-size or B-size slot 0 controller. The VXI chassis 100 is easily configurable with the slot 0 resource in either the front (C-size location) or the rear (B-size location) of the chassis 100 due to the unique backplane design of the present invention. Thus, a B-size slot 0 VXI controller can be used in the system, freeing up all six C-size slots for instruments. Since the B-size slots are completely VXI compliant, the user can take advantage of all of the VXI capabilities for slot identification resource initialization and management with lower cost while enabling use of all six C-size slots for instrument modules. Also, a standard C-size slot 0 VXI controller can be used in the VXI chassis system, thus enabling use of three B-size VXI/VME slots in the rear of the chassis to incorporate VME memory cards or special purpose modules. Thus the VXI chassis 100 of the present invention provides an innovative solution for using both C-size VXI and B-size VXI/VME resources in a single system. This provides increased options to the user and reduces system costs.

The user can easily switch the slot 0 resource from the front of the chassis, i.e., C-size slots, to the rear of the chassis, i.e., B-size slots, and vice versa. Switching the slot 0 location between C-size and B-size slots is simple and requires no tools. In the preferred embodiment, the user simply switches the orientation of the personality card 160 located on the inside panel of the VXI chassis.

As noted above, other methods may be used for switching the slot 0 location of the VXI mainframe. In another embodiment, jumpers and/or dip switches are used to enable the user to selectively configure the VXI chassis with different slot 0 locations. In another embodiment, the slot 0 location is selected programmatically in software. Other methods for changing or selecting the slot 0 location within the VXI chassis 100 may be used as desired.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A personality module which performs signal routing for configurable slot 0 locations, wherein the personality module is adapted to be coupled to a backplane, wherein the personality module is a plug-in card adapted to be inserted into a corresponding personality module connector electrically connected to the backplane, wherein the personality module includes:

a first side including a first set of edge connectors; and
a second side including a second set of edge connectors;
wherein when the first set of edge connectors are inserted into the personality module connector, the personality module operates to route signals on the backplane to enable a first connector to operate as a slot 0 connector on the backplane; and
wherein when the second set of edge connectors are inserted into the personality module connector, the personality module operates to route signals on the backplane to enable a second connector to operate as a slot 0 connector on the backplane.

2. The personality module of claim 1, wherein the personality module is adapted to be coupled to a backplane of a chassis, wherein the chassis includes the personality module connector and includes a plurality of device connectors;

wherein the personality module is operable to selectively route signals on the backplane to enable selected ones of the plurality of device connectors to operate as a slot 0 connector.

3. The personality module of claim 2, wherein
wherein the personality module can be oriented in one of a plurality of positions in the personality module connector to selectively route signals on the backplane to enable one of the plurality of device connectors to operate as a slot 0 connector.

4. A personality module adapted to be coupled to a backplane of a chassis, wherein the chassis includes a personality module connector electrically connected to the backplane and a plurality of device connectors each electrically connected to the backplane, wherein the personality module is a plug-in card adapted to be inserted into the personality module connector, wherein the personality module includes:

a first side including a first set of edge connectors; and
a second side including a second set of edge connectors;
wherein when the first set of edge connectors are inserted into the personality module connector, the personality module operates to route signals on the backplane to enable a first device connector to operate as a slot 0 connector on the backplane; and
wherein when the second set of edge connectors are inserted into the personality module connector, the personality module operates to route signals on the backplane to enable a second device connector to operate as a slot 0 connector on the backplane.

5. A system which provides configurable slot 0 locations, the system comprising:

a chassis, including:
a housing;
a backplane comprised in the housing and adapted for transmitting electrical signals; and
a plurality of connectors positioned in the housing and electrically coupled to the backplane, wherein the plurality of connectors are adapted to receive expansion cards; and
a personality module adapted to be coupled to the backplane, wherein the personality module is operable to selectively route signals on the backplane to enable selected ones of the plurality of connectors to operate as a slot 0 connector.

6. The system of claim 5, wherein the personality module can be oriented in one of a plurality of positions to selectively route signals on the backplane to enable one of the plurality of connectors to operate as a slot 0 connector.

7. The system of claim 6, the chassis further comprising:
a personality module connector coupled to the backplane;
wherein the personality module is a plug-in card adapted to be coupled to the personality module connector.

8. The system of claim 7, further comprising:
wherein the personality module includes a first side including a first set of edge connectors, and wherein the personality module includes a second side including a second set of edge connectors;
wherein when the first set of edge connectors are inserted into the personality module connector, the personality module operates to route signals on the backplane to enable a first one of the plurality of connectors to operate as a slot 0 connector; and
wherein when the second set of edge connectors are inserted into the personality module connector, the personality module operates to route signals on the backplane to enable a second one of the plurality of connectors to operate as a slot 0 connector.

9. The system of claim 5, wherein the chassis is a VXI chassis, wherein the plurality of connectors are adapted to receive VXI and/or VME cards.

10. The system of claim 5, wherein the housing is configured to define a plurality of slots, wherein each of the slots is adapted to receive an expansion card, wherein the plurality of slots includes a first plurality of slots adapted to receive cards of a first size, and wherein the plurality of slots includes a second plurality of slots adapted to receive cards of a second size;

wherein the plurality of connectors include a first plurality of connectors adapted to receive expansion cards of the first size, and wherein the plurality of connectors include a second plurality of connectors adapted to receive expansion cards of the second size;
wherein the personality module is operable to selectively route signals on the backplane to enable one of either the first plurality of connectors or the second plurality of connectors to operate as a slot 0 connector.

11. The system of claim 10, wherein the personality module can be oriented in one of two positions to selectively route signals on the backplane to enable one of either the first plurality of connectors or the second plurality of connectors to operate as a slot 0 connector.

12. The system of claim 10, wherein the first plurality of slots are adapted to receive C-size VXI cards, and wherein the second plurality of slots are adapted to receive B-size VXI or VME cards.

13. The system of claim 10, wherein the housing includes a member comprised in the housing, wherein the backplane is comprised on the member, wherein the member includes first and second opposite sides;

wherein the first plurality of connectors are comprised on the first side of the member, and wherein the second plurality of connectors are comprised on the second opposite side of the member.

14. A system which provides configurable slot 0 locations, the system comprising:

a chassis adapted to receive expansion cards, the chassis comprising:
a housing, wherein the housing is configured to define a plurality of slots, wherein a first subset of the plurality of slots is adapted to receive cards of a first size, and wherein a second subset of the plurality of slots is adapted to receive cards of a second size;

a backplane comprised in the housing and adapted for transmitting electrical signals;

a first plurality of connectors positioned in the housing and electrically coupled to the backplane, wherein the first plurality of connectors are positioned in the housing proximate to the first subset of the plurality of slots, wherein the first plurality of connectors are adapted to receive expansion cards of the first size;

a second plurality of connectors positioned in the housing and electrically coupled to the backplane, wherein the second plurality of connectors are positioned in the housing proximate to the second subset of the plurality of slots, wherein the second plurality of connectors are adapted to receive expansion cards of the second size; and a personality module connector coupled to the backplane; and a personality module adapted to be coupled to the personality module connector, wherein the personality module is operable to selectively route signals on the backplane to enable one of either the first plurality of connectors or the second plurality of connectors to operate as a slot 0 connector.

15. The system of claim 14, wherein the personality module can be oriented in one of two positions to selectively route signals on the backplane to enable one of either the first plurality of connectors or the second plurality of connectors to operate as a slot 0 connector.

16. The system of claim 15, wherein the personality module is a plug-in card, wherein the personality module includes a first side including a first set of edge connectors, and wherein the personality module includes a second side including a second set of edge connectors;

wherein when the first set of edge connectors are inserted into the personality module connector, the personality module operates to route signals on the backplane to enable one of the first plurality of connectors to operate as a slot 0 connector;

wherein when the second set of edge connectors are inserted into the personality module connector, the personality module operates to route signals on the backplane to enable one of the second plurality of connectors to operate as a slot 0 connector.

17. The system of claim 14, wherein the chassis is a VXI chassis, wherein the first plurality of connectors and the second plurality of connectors are adapted to receive VXI and/or VME cards.

18. The system of claim 17, wherein the first subset of the plurality of slots is adapted to receive C-size VXI cards, and wherein the second subset of the plurality of slots is adapted to receive B-size VXI or VME cards.

19. The system of claim 18, wherein the first plurality of connectors comprise VXI P1 and P2 connectors, and wherein the second plurality of connectors comprise VXI P1 and P2 connectors.

20. The system of claim 14, wherein the housing includes a member comprised in the housing, wherein the backplane is comprised on the member, wherein the member includes first and second opposite sides;

wherein the first plurality of connectors are comprised on the first side of the member, and wherein the second plurality of connectors are comprised on the second opposite side of the member.

21. A system which provides configurable slot 0 locations, the system comprising:

a chassis, including:

a housing;

a backplane comprised in the housing and adapted for transmitting electrical signals; and a plurality of connectors positioned in the housing and electrically coupled to the backplane, wherein the plurality of connectors are adapted to receive expansion cards; and signal routing means coupled to the backplane, wherein the signal routing means is operable to selectively route signals on the backplane to enable selected ones of the plurality of connectors to operate as a slot 0 connector.

22. The system of claim 21, wherein the signal routing means comprises a personality module adapted to be coupled to the backplane, wherein the personality module is operable to selectively route signals on the backplane to enable selected ones of the plurality of connectors to operate as a slot 0 connector.

23. The system of claim 21, wherein the signal routing means comprises jumpers coupled to the backplane, wherein the jumpers can be placed in selected configurations and are operable to selectively route signals on the backplane to enable selected ones of the plurality of connectors to operate as a slot 0 connector.

24. The system of claim 21, wherein the signal routing means comprises dip switches coupled to the backplane, wherein the dip switches can be placed in selected configurations and are operable to selectively route signals on the backplane to enable selected ones of the plurality of connectors to operate as a slot 0 connector.

25. The system of claim 21, wherein the chassis is a VXI chassis, and wherein the plurality of connectors are adapted to receive VXI and/or VME cards.

26. The system of claim 21, wherein the housing is configured to define a plurality of slots, wherein the plurality of slots includes a first plurality of slots adapted to receive cards of a first size, and wherein the plurality of slots includes a second plurality of slots adapted to receive cards of a second size;

wherein the plurality of connectors include a first plurality of connectors adapted to receive expansion cards of the first size, and wherein the plurality of connectors include a second plurality of connectors adapted to receive expansion cards of the second size;

wherein the signal routing means is operable to selectively route signals on the backplane to enable one of either the first plurality of connectors or the second plurality of connectors to operate as a slot 0 connector.

27. The system of claim 26, wherein the first plurality of slots are adapted to receive C-size VXI cards, and wherein the second plurality of slots are adapted to receive B-size VXI cards.

28. The system of claim 26, wherein the housing includes a member comprised in the housing, wherein the backplane is comprised on the member, wherein the member includes first and second opposite sides;

wherein the first plurality of connectors are comprised on the first side of the member, and wherein the second plurality of connectors are comprised on the second opposite side of the member.

29. A method for changing a slot 0 location in a VXI chassis, wherein the VXI chassis includes a backplane adapted for transmitting electrical signals and a plurality of connectors electrically coupled to the backplane, wherein the plurality of connectors are adapted to receive VME and/or VXI expansion cards, wherein the VXI chassis further includes a personality module connector coupled to the backplane and adapted to receive a personality module, the method comprising:

inserting a first edge connector of the personality module into the personality module connector, wherein the inserting the first edge connector of the personality module operates to selectively route signals on the backplane to enable a first connector to operate as a slot 0 connector;

removing the personality module from the personality module connector;

inserting a second edge connector of the personality module into the personality module connector, wherein the inserting the second edge connector of the personality module operates to selectively route signals on the backplane to enable a second connector to operate as a slot 0 connector.

30. A chassis which has configurable slot 0 locations, the chassis comprising:

a housing, wherein the housing is configured to define a plurality of slots, wherein each of the slots is adapted to receive an expansion card;

a backplane comprised in the housing and adapted for transmitting electrical signals;

a plurality of connectors positioned in the housing and electrically coupled to the backplane, wherein the plurality of connectors are adapted to receive expansion cards; and a personality module adapted to be coupled to the backplane, wherein the personality module is operable to selectively route signals on the backplane to enable selected ones of the plurality of connectors to operate as a slot 0 connector.

* * * * *